United States Patent [19]

Ishii et al.

[11] Patent Number: 4,728,370

[45] Date of Patent: Mar. 1, 1988

[54] AMORPHOUS PHOTOVOLTAIC ELEMENTS

[75] Inventors: Masayuki Ishii; Nobuhiko Fujita; Hajime Hitotsuyanagi, all of Hyogo, Japan

[73] Assignee: Sumitomo Electric Industries, Inc., Osaka, Japan

[21] Appl. No.: 901,286

[22] Filed: Aug. 28, 1986

[30] Foreign Application Priority Data

Aug. 29, 1985 [JP] Japan ............................... 60-190500

[51] Int. Cl.⁴ ............................................. H01L 31/06
[52] U.S. Cl. ........................................ 136/258; 357/30
[58] Field of Search ............... 136/258 AM; 357/30 J, 357/30 K, 59 C, 30 N

[56] References Cited

U.S. PATENT DOCUMENTS 4,471,155  9/1984  Mohr et al. ...................... 136/258
4,542,256  9/1985  Wiedeman ...................... 136/249

FOREIGN PATENT DOCUMENTS 56-150876 11/1981 Japan ........................... 136/258 AM
57-43477   3/1982 Japan ........................... 136/258 AM Primary Examiner—Aaron Weisstuch
Attorney, Agent, or Firm—Kerkam, Stowell, Kondracki & Clarke

[57] ABSTRACT

Disclosed are pin or nip type amorphous photovoltaic elements having the i-type layer comprised of an a-SiGe: H film, which are characterized in that an i-type amorphous silicon buffer layer is disposed between the layers of p-type and i-type and thus, the mutual diffusion of impurities and/or elements added to the i-type and/or the p-type layers through the p/i boundary is effectively restricted due to the presence of the buffer layer. As a result the formation of defects at the p/i boundary and the deterioration of the p-type layer are effectively prevented, and the properties important to these kinds of devices, such as Voc, Jsc, FF being substantially improved, thereby making it possible to provide photovoltaic elements such as solar batteries having a practically acceptable long life span and a high reliability.

5 Claims, 3 Drawing Figures

AMORPHOUS PHOTOVOLTAIC ELEMENTS

BACKGROUND OF THE INVENTION

1. Field of the Invention

The present invention relates to an amorphous photovoltaic element. More particularly, the present invention pertains to an amorphous photovoltaic element such as a solar battery including a pin type junction having excellent electric properties, a high photoelectric conversion efficiency, and a high reliability.

2. Description of the Prior Art

A solar battery is a typical example of an electronic device utilizing the photovoltaic effect. The solar battery permits the conversion of solar energy, which has a quite wide spectral distribution spreading over the range of from 0.3 to 3 $\mu$m, or the light energy of other light sources into electric energy and therefore, it serves as a clean, inexhaustable future energy source. In the solar battery, the conversion of light energy to electric energy is performed due to the photoelectric conversion effect which is an essential property of different kind of junctions such as heterojunctions, pn or pin (or nip) junctions of a semiconductor, or Schottky junctions. These junctions absorb incident light and form pairs of electrons at the boundary thereof and (positive) holes which can be outputted and used as an electric current, for example, in the case of the solar battery.

Recently, amorphous semiconductor films such as an amorphous silicon (a-Si:H) film have been suggested as a material for preparing photovoltaic elements such as solar batteries, because of their properties such that an amorphous layer having a low thickness and a relatively large area may be prepared. Layers having different compositions may easily be realized, and the electrical and optical properties of the layer may be widely changed or controlled. For instance, solar batteries obtained using amorphous semiconductor materials have an absorption coefficient with respect to light of about 500 nm, which is the peak value in the solar energy distribution, ten times larger than that of crystalline silicon. These amorphous layers may be formed at a relatively low temperature condition and may be directly formed from starting materials by, for example, the glow discharge discharge technique. Moreover, the junctions such as mentioned above can also be easily formed.

In order to design, produce, and practically use a photovoltaic element, in particular, a solar battery, it is quite important to enhance or improve the photoelectric conversion efficiency thereof. Under such circumstances, Y. Hamakawa et al. (*Appl. Phys. Lett.*, 1979, 35, 187) proposes a solar battery composed of a multi-layer structure such as the pin/pin/ . . . /pin or nip/nip/ . . . /nip type structure in which an asymmetric electromotive force is generated due to the recombination taking place at the boundary between the n-type and p-type layers directly in contact with each other. In this kind of solar battery according to this article, a number of unit solar cells are electrically communicated in series and accordingly it is expected to supply a high electromotive force.

In addition, it is desirable to strictly select the starting material for manufacturing solar batteries and a structure which makes it possible to impart a good absorption coefficient, with respect to the entire solar energy distribution extending over a wide spectral range, to a solar battery in order to substantially improve the conversion efficiency thereof. For that purpose, it has been proposed that a certain element (a modifier) be added to an a-Si:H layer to change the width of the forbidden band thereof. For such a modifier, Group IV elements of the Periodic Table capable of forming 4-cordination bonds with silicon may be utilized.

If carbon, for instance, is used as the modifier, the width of the forbidden band of the amorphous silicon layer becomes wider than that of a layer free of the modifier. Therefore, if the layer of amorphous silicon containing carbon atoms as a modifier is used as the p-type layer situated at the side which is irradiated with the incident light, a solar battery which effectively converts the energy of the light having relatively short wave length to electric energy is provided, that is, the use of such modifier permits an improvement in the photoelectric conversion efficiency (see, for example, Y. Hamakawa et al., *Appl. Phys. Lett.*, 1981, 39, 273). However, if germanium (Ge) (for example, amorphous silicon germanium=a-SiGe:H, see, G. Nakamura et al., *J. Appl. Phys.*, 1981, 20, Suppl. 20-2, 227), tin (Sn), lead (Pb) or the like is used as the modifier, the forbidden band of the amorphous silicon layer becomes narrower than that of a layer free of the modifier. Therefore, if such modified amorphous silicon layer is used to form an i-type layer, a solar battery including such i-type layer is improved in the sensitivity to light of longer wavelengths and thus effectively absorbs light having a long wavelength. In general, it becomes possible to effectively utilize the solar energy distributed over a wide spectral range by arranging the layers constituting a solar battery so that the width of the forbidden band of the layers is gradually narrowed from the side irradiated with the incident light by the use of p-type and i-type layers having properties improved by the addition of modifiers.

An amorphous silicon solar battery comprising an i-type layer composed of an a-Si:H film which provides a high photoelectric conversion efficiency and which is a cheap thin film forming material for this type of solar battery, is expected to have excellent properties because of its high sensitivity to light of long wavelength. Thus, a solar battery comprised of a glass substrate/a transparent electrode/a pin junction/a metal electrode, in which the p-type and n-type layers are comprised of an a-Si:H film and the i-type layer is composed of an a-SiGe:H film may be manufactured. However, the pin type of solar battery having the construction mentioned above is inferior in its battery properties. Therefore, it is required to improve the properties thereof in order to put solar batteries having such structure into practical use.

Referring to the conventional type of solar battery mentioned above in which a p-type layer of a-Si:H is disposed adjacent to the i-type layer of a-SiGe:H, impurities such as boron (B) are added to the p-type layer to assure the p-type nature thereof, since the a-Si:H layer has a weak n-type nature. However, the impurities tend to penetrate into the neighbouring i-type layer due to diffusion or they contaminate the i-type layer during the deposition procedures (in the film forming chamber). Thus, the i-type layer may be converted to a p-type one, which may cause a lowering of the strength of the internal field and reduction in the output properties. Moreover, lattice mismatching is often observed at the boundary between the i-type layer to which germanium (Ge) is added and the p-type layer free of Ge (hereafter referred to as the p/i boundary). These defects result in an extreme reduction of the output current and the fill factor (FF) as well as other output properties of the solar battery. That is, the output current, the open circuit voltage (Voc) and the factor (FF) of the solar battery are all reduced.

In general, the p-type layer serves to conduct the light as much as possible to the neighbouring i-type layer and also acts as an electrode of the battery. However, the added element (Ge) in the i-type layer penetrates into the p-type layer due to diffusion during the formation of the former, in particular, around the p/i boundary, which leads to a reduction of the bandgap energy of the p-type layer. Thus, the film characteristics inherent to the p-type layer are remarkably impaired and the latter does not perform the role of transmitting light to the neighbouring i-type layer. As a result, the amount of light which arrives at the i-type layer is significantly reduced and in turn this results in a reduction in the output current of the solar battery. Moreover, the reduction in the bandgap energy causes a lowering of the built-in potential and accordingly the open circuit voltage, having a close relationship to the built-in potential, is lowered.

These phenomena i.e., the penetration of boron (B) included in the p-type layer into the i-type layer due to diffusion, the electric junction loss due to the lattice mismatching at the p/i boundary, and the diffusion of Ge atoms contained in the i-type layer into the p-type layer mentioned above take place not only during the film formation procedures but during the use of the devices having the structure described above, such as solar batteries, and they cause a reduction in the output properties thereof.

BRIEF EXPLANATION OF THE INVENTION

As seen from the above description, conventional amorphous multi-layer type devices such as solar batteries have a number of disadvantages. Consequently, there has been a strong need for solar batteries which have no such disadvantage and, on the contrary, provide an extremely high reliability and a high photoelectric conversion efficiency. Improvement of such solar batteries in the above mentioned points makes it possible to promote the practical use thereof.

Thus, the principle object of this invention is to provide a new pin type amorphous photovoltaic element having a novel construction which permits the elimination of the disadvantages inherent in the conventional devices such as solar batteries.

Another object of the present invention is to provide a solar battery having a high photoelectric conversion efficiency and a high reliability such that reduction in the output properties thereof does not occur even during the practical use thereof.

A still further object of this invention is to provide a method for manufacturing the photovoltaic elements having excellent properties such as mentioned above.

The inventors have conducted studies on the conventional pin type amorphous solar batteries in which the i-type layer is composed of an a-SiGe:H film, while the p-type layer is composed of an a-Si:H film including an impurity such as boron (B) and have found that the disadvantages of the conventional solar battery explained above result from the fact that there is a transfer of the added elements such as B and Ge between the neighbouring layers, in particular, the i-type layer and the p-type layer, and further have found that these problems can effectively be solved by disposing or inserting a buffer layer between the p-type layer and the i-type layer.

Thus, the above mentioned and other objects of this invention can be achieved by providing a pin type photovoltaic element having a novel construction which has excellent output properties compared with the conventional one, the photovoltaic element according to the present invention comprising a p-type amorphous silicon layer and an i-type amorphous silicon germanium layer, and characterized in that a buffer layer of an i-type amorphous silicon film is disposed between the p-type a-Si:H layer and the i-type a-SiGe:H layer.

BRIEF DESCRIPTION OF THE ATTACHED DRAWINGS

The pin type amorphous photovoltaic element according to the present invention will now be described in more detail while referring to the accompanying drawings; wherein like features are represented by like reference numerals in FIGS. 1 and 2.

DETAILED EXPLANATION OF THE INVENTION

For simplicity, the present invention will hereafter be explained with reference to the solar battery as a typical example of the photovoltaic element. However, it should be understood that the invention is not restricted thereto.

Figure 1:
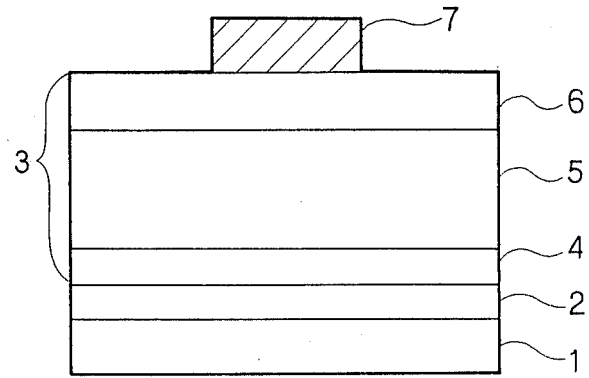
FIG. 1 is an illustrative sectional view of a conventional photovoltaic element.

A conventional solar battery has, for example, a structure as shown in FIG. 1.

From FIG. 1, the conventional solar battery, in general, comprises a glass substrate 1, a transparent electrode 2, an amorphous layer 3 comprising a p-type layer 4, an i-type layer 5, and an n-type layer 6, and a metal electrode 7 successively formed on the substrate 1 in this order. The solar battery having the structure shown in FIG. 1 is greatly improved in sensitivity to light of long wavelength due to the fact that an a-SiGe:H film is used as the i-type layer, as explained before. However, it cannot be practically applied because of its low output current, open circuit voltage, and fill factor. The inventors found that the reduction in these factors is mainly due to, in particular, the penetration of impurities such as boron included in the p-type layer into the neighbouring i-type layer due to its diffusion through the p/i boundary and such phenomenon leads to a reduction in the internal electric field and becomes a cause of the disadvantages mentioned above.

The problems encountered in the conventional photovoltaic elements and in particular the solar battery will hereafter be explained more in detail. In order to put the solar battery into practical use, it is quite important to improve the properties, particularly, the photoelectric conversion efficiency ($E_{ff}$), the open circuit voltage (Voc), the short circuit current density (Jsc), and the fill factor (FF) of the solar battery. However, it is not possible to obtain a pin (or nip) type or a multi-layer type amorphous solar battery having acceptable properties if one adopts the structure shown in FIG. 1, since the materials for the films used to form, for instance, the multi-layer type battery are insufficient in their physical and chemical properties.

The reduction in the properties of the solar battery is mainly caused due to the following phenomena: (i) the mutual diffusion of the dopant or added element in the p-type layer and the i-type layer, which takes place between these layers through the p/i boundary; (ii) the contamination of each layer with such dopants or added elements during the film forming procedures; and (iii) the formation of junctions due to the presence of heterogeneous materials at the p/i boundary which leads to electrical junction loss. These phenomena cause a reduction in the bandgap energy to the p-type layer and in turn a reduction in the built-in potential and the open circuit voltage, which is closely related to the latter. Moreover, the amount of light arriving at the i-type layer is also lowered due to these phenomena and as a result the output power (or the conversion efficiency) of the solar battery is significantly reduced. The phenomena which cause the deterioration of the properties are often observed even during the use of the solar battery and consequently the life span thereof is remarkably shortened.

However, the disadvantages accompanied by the conventional solar batteries mentioned above can be eliminated by adopting the structure in which a buffer layer, hereafter described more in detail, is incorporated.

Figure 2:
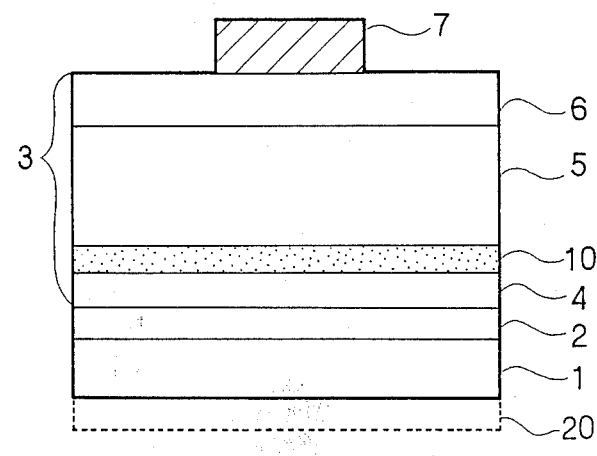
FIG. 2 is an illustrative sectional view of a preferred embodiment of the solar battery according to the present invention.

A preferred example of the amorphous photovoltaic element according to the present invention is illustrated in FIG. 2 and it comprises, for example, a transparent substrate 1, a transparent electrode 2, amorphous layers 3, and a metallic electrode 7 which are arranged in order from the side to which the incident light is irradiated, the amorphous layers 3 being comprised of four layers i.e., a p-type layer 4 (a-Si:H), a buffer layer 10 (a-Si:H), an i-type layer 5 (a-SiGe:H), and an n-type layer 6 (a-Si:H). In this embodiment, the incident light is irradiated on the surface of the substrate 1 and therefore, the substrate 1 and the electrode 2 are made from transparent materials. Moreover, in this FIG. 2, a solar battery including only one pin junction is illustrated; however, the solar battery according to the present invention is not restricted to such embodiment and may include two or more pin junctions. In such case, it is also advantageous to insert a buffer layer between the neighbouring layers of p-type and i-type if the i-type layer is comprised of an a-SiGe:H film.

In the amorphous photovoltaic elements such as solar batteries, each layer of p-type, i-type, or n-type contains hydrogen and/or fluorine. These elements act as terminators for dangling bonds existing in each amorphous layer.

The thickness of the buffer layer, the use of which is the principal characteristic of the present invention, falls within the range of from 100 to 500 Å. This is critical in the present invention and if the thickness thereof is less than 100 Å, the buffering effect of the layer cannot be expected at all i.e., the diffusion of impurities takes place through the p/i boundary, while if the thickness is higher than 500 Å, the amount of the light arriving at the layers situated behind the p-type layer is extremely reduced, although the diffusion is effectively restricted in this case. Therefore, it is preferred to limit the thickness to the above range. Moreover, Ge may be added to a part of the i-type buffer layer over a thickness of from 50 to 150 Å at the side thereof adjacent to the i-type layer so that the amount of added Ge is gradually increased towards the i-type layer.

In general, the i-type layer comprised of a-Si:H is slightly n-type and therefore, a Group III element such as boron (B) is added thereto to convert it to intrinsic type. The amount of such added element falls within the range of from 0.2 to 3 ppm, which is also a critical condition of the present invention. That is, if the amount thereof is less than 0.2 ppm, the intrinsic layer may not be obtained, while if it is added in an amount of more than 3 ppm, the layer becomes p-type.

As the substrate for the photovoltaic elements according to the present invention, there may be mentioned glass; ceramics such as $Al_2O_3$, $ZrO_2$, SiC, $Si_3N_4$, $TiO_2$, and AlN; plastics such as polyimides, polyethylene terephthalate, polyethylene, polystyrene, polypropylene, and polyvinyl chloride; metals such as Al, Cu, Mo, mild steel; alloys such as stainless steel, Kovar, Invar, Super invar, Stainless invar and Fe-Pb alloys. The thickness thereof is in general about 1 mm; however, it may voluntarily be selected depending on the use, the size of the element, or the like. In addition, the materials for the transparent electrode may be selected from the group consisting of conductive films such as of ITO (Indium Tin Oxide) and $SnO_2$ and the material for the metallic electrode may be selected from the group consisting of Al, Au, and Cu.

The materials for the substrate and the electrode are selected depending on the type or kind of the photovoltaic element. For example, in the solar battery as shown in FIG. 2, these members should be composed of transparent materials since the incident light is introduced into the element through the substrate. Moreover, the photovoltaic element according to the present invention may be composed of a substrate of an opaque material and an electrode 7 of a transparent material such as ITO so that the incident light can be introduced into the element through the electrode 7. It is also possible to use a substrate made from a conductive material so that the substrate can also act as an electrode through which the output current or voltage can be picked up.

The electrode layer, generally, has a thickness of 5,000 Å (in the case of the transparent electrode, it is in the order of 1 $\mu$m) and it can be deposited according to a conventional film forming technique such as the CVD method, the vacuum deposition method, etc. In addition, a conventional technique such as the photolithography technique can be utilized when patterning of the electrode is necessary.

Each amorphous layer is composed of the materials already mentioned and can be deposited on the substrate or the electrode according to various kinds of CVD techniques such as plasma CVD (glow discharge method or the like), photo CVD (direct excitation photo CVD, mercury sensitized photo CVD, or the like), and sputtering. For instance, when the amorphous layers are formed according to the plasma CVD method, the n-type layer is formed utilizing a principal ingredient such as $SiH_4$, $Si_2H_6$, $SiF_4$; a diluent thereof such as $H_2$, and a dopant gas such as $PH_3$, $AsH_3$, $Sb(CH_3)_3$, $Bi(CH_3)_3$. In order to form the i-type layer, a Si source such as $SiH_4$, $Si_2H_6$, or $SiF_4$ and a Ge source such as $GeH_4$ or $GeF_4$ are used together with a diluent gas such as $H_2$ as in the case of the i-type layer. The buffer layer is produced from a principal ingredient such as $SiH_4$, $Si_2H_6$, $SiF_4$ in combination with a diluent (such as $H_2$). Ge may be added to a portion of the buffer layer to form a graded layer at the side adjacent to the i-type layer so that the Ge concentration is gradually increased towards the latter as mentioned above. In this case, the graded layer can be produced by adding a Ge source such as the materials listed above to the ingredient gas for the buffer layer and changing the amount thereof with time during the film forming step. The thickness of the portion of the buffer layer, to which Ge is added falls within the range of from 50 to 150 Å, preferably 70 to 120 Å. This is critical and if the thickness thereof is less then 50 Å, the elimination of the Ge diffusion (i.e., buffering effect) is not assured, while if it is more than 150 Å, the buffering effect is not expected. Therefore, the thickness is desirably restricted to the range descriabed above. Finally, in order to form the p-type layer, an Si source such as $SiH_4$, $Si_2H_6$, or $SiF_4$ is used in the presence of diluent $H_2$. The effective ingredient for the dopant for the p-type layer is $B_2H_6$.

In FIG. 2, the amorphous layers deposited on the substrate are arranged in the order of p-b-i-n (b: the buffer layer); however, they can be deposited in the reverse order i.e., n-i-b-p from the side of the substrate.

According to the present invention, an antireflection film 20 (in FIG. 2, this is shown by the dotted line) may be formed on the transparent conductive film to which the incident light is irradiated in order to improve the light absorption efficiency of the element. In this respect, the transparent conductive film such as ITO or $SiO_2$ films can act as the antireflection film and as the electrode simultaneously and therefore, it is possible to use a transparent conductive film such as ITO or $SiO_2$ as the transparent electrode placed at the light incidence side, in which the ITO or $SiO_2$ film can simultaneously perform two functions, on the one hand as the electrode and on the other hand as the antireflection film for incident light. As the materials for the antireflection film besides ITO, there may also be mentioned SiO, $SiO_2$, $ZrO_2$, ZnS, $Si_3N_4$, $Ta_2O_5$, $Al_2O_3$, $Sb_2O_3$, and $TiO_2$. Moreover, those having a multi-layer construction may also be applicable (for instance, $Ta_2O_5/SiO_2$). These antireflection films can be produced by any of the known film forming techniques such as vacuum deposition, sputtering, and plasma CVD, which can suitably be selected depending on the kind of the material to be deposited.

According to the present invention, the various factors, which may possibly cause the deterioration of the properties of the photovoltaic elements such as solar batteries, can effectively be eliminated by disposing or inserting a buffer layer comprised of an i-type a-Si:H layer having a desired thickness and optionally including a graded layer of a desired thickness at the side adjacent to the i-type layer, between the p-type and i-type layers. It has been known that the diffusion of added elements and/or doped elements takes place therebetween. In other words, the a-Si:H layer (the buffer layer) free of Ge serves as a barrier or a buffer for substantially restricting the occurrence of diffusion of a dopant (such as B in the p-type layer) and/or an added element (such as Ge in the i-type layer) for modifying the film property, which takes place between the neighbouring layers of p-type and i-type, and effectively prevents each film from deterioration of its properties. This makes it possible to maintain the inherent characteristics electrical and/or chemical) of each film. Therefore, in the photovoltaic element according to the present invention, reduction in the bandgap energy of the p-type layer and in the amount of light arriving at the i-type layer are not observed due to the elimination of the diffusion or penetration of the element Ge included in the i-type layer, even during the practical use thereof. Therefore, the inherent characteristics of the p-type layer can effectively be available, and as a result, the layer serves to conduct a large amount of light as much as possible to the i-type layer and also serves as the electrode.

Referring to the i-type layer, it is not converted to p-type, since the diffusion or penetration of boron (B) included in the neighbouring p-type layer into the i-type layer is effectively prevented due to the presence of a buffer layer and thus, the i-type layer maintains an internal field of sufficient strength. This allows us to obtain a photovoltaic elements having excellent output properties such as output current, open circuit voltage, and fill factor.

With respect to the a-SiGe: H film, the amount of Ge to be added thereto may generally be adjusted to change the width of the forbidden band of the i-type layer and accordingly the amorphous silicon solar battery including the i-type layer comprised of such a-SiGe:H film has a high sensitivity to light having a long wavelength and thus is considered effective for practical use. Therefore, if a buffer layer is incorporated in the solar battery having the construction mentioned above, according to the present invention, to assure the stability of the p-type and i-type layers, an excellent photovoltaic element, for instance, a solar battery can be provided, which has an extremely good sensitivity to light of longwave length and in turn provides a high photoelectric conversion efficiency.

Moreover, Ge can be added to the buffer layer so that the concentration thereof is gradually increased towards the neighbouring i-type layer over a thickness of from 50 to 150 Å according to the present invention. This treatment is quite effective to restrict the formation of a junction, which causes the electrical junction loss, at the boundary between the i-type buffer layer (a-Si:H) and the i-type layer (a-SiGe:H) due to the presence of the buffer layer. Moreover, the inherent properties of the p-type and i-type layers are maintained due to the addition of Ge to the buffer layer. To that effect, it is important to add the element Ge to the part of the buffer layer in which a Ge concentration gradient is established so as to increase the Ge concentration towards the i-type layer.

Furthermore, the structure of the photovoltaic element according to the present invention makes it possible to provide final articles having a remarkably long life span and a high reliability, due to the elimination of the diffusion of the added elements and/or impurities, which is encountered in the conventional devices, through the p/i boundary even during the practical use.

In addition, in the photovoltaic elements according to the present invention, an antireflection film can be deposited on the top of the element, to which the incident light is irradiated, so as to improve the light absorption efficiency and the conversion efficiency of the elements. The antireflection film may be a single film effective for light having a wavelength falling within a specific range or it may be a film or multi-layer structure obtained by laminating at least two films of materials having different refractive indices, which is effective for light over a wide range of wavelength.

The buffer layer according to the present invention may be applicable to any kind of photovoltaic elements including an i-type layer composed of the a-SiGe:H film. Moreover, the photovoltaic element according to the present invention can be used as a component for a tandem type photovoltaic element or a multi-color photovoltaic element, which comprises the photovoltaic element according to the present invention and other photovoltaic elements optically connected in series.

The present invention will hereafter be explained more in detail with reference to practical examples for manufacturing the amorphous photovoltaic element according to the invention and the effects practically attained will also be discussed in comparison with reference examples and comparative examples.

EXAMPLES

A glass plate having a thickness of 1 mm was used as a substrate (the width of the forbidden band: Eg=5.0 eV). According to the CVD technique, $SnO_2$ was deposited on the surface of the glass plate in a thickness of 1 μm (Eg=4.0 eV). Then, a p-type layer (a-Si:H; dopant=boron; Eg=1.8 eV), a buffer layer (a-Si:H; Eg=1.8 eV), an i-type layer (a-SiGe:H containing 2 ppm of boron as dopant; Eg=1.6 eV), and an n-type layer (a-Si:H containing phosphorus P as dopant; Eg=1.8 eV) were deposited in order according to the plasma CVD technique under identical conditions, with the thicknesses as listed in the following Table I.

Furthermore, a comparative sample in which the buffer layer was not disposed between the layers of p-type and i-type was also prepared for the purpose of comparison.

Then, an electrode of Al was deposited on each sample produced above at a thickness of 5,000 Å according to the vacuum deposition technique and thus solar batteries, as shown in FIGS. 1 and 2, comprising only one pin junction were obtained. The measurement of output properties was carried out on these samples and the results obtained are listed in the following Table I:

that the thickness of the buffer layer should be restricted to the range of from 100 to 500 Å as already mentioned above.

In addition, a continuous light irradiation test over 500 hours was effected on the samples of Ex. 3 and the comparative example. In this test, a light source (AM (air-mass)=1.5; 100 mW/cm²) was used and the continuous light irradiation was performed on the sample which was in the open circuit state. The results thus obtained are plotted in the accompanying drawing (FIG. 3).

Figure 3:
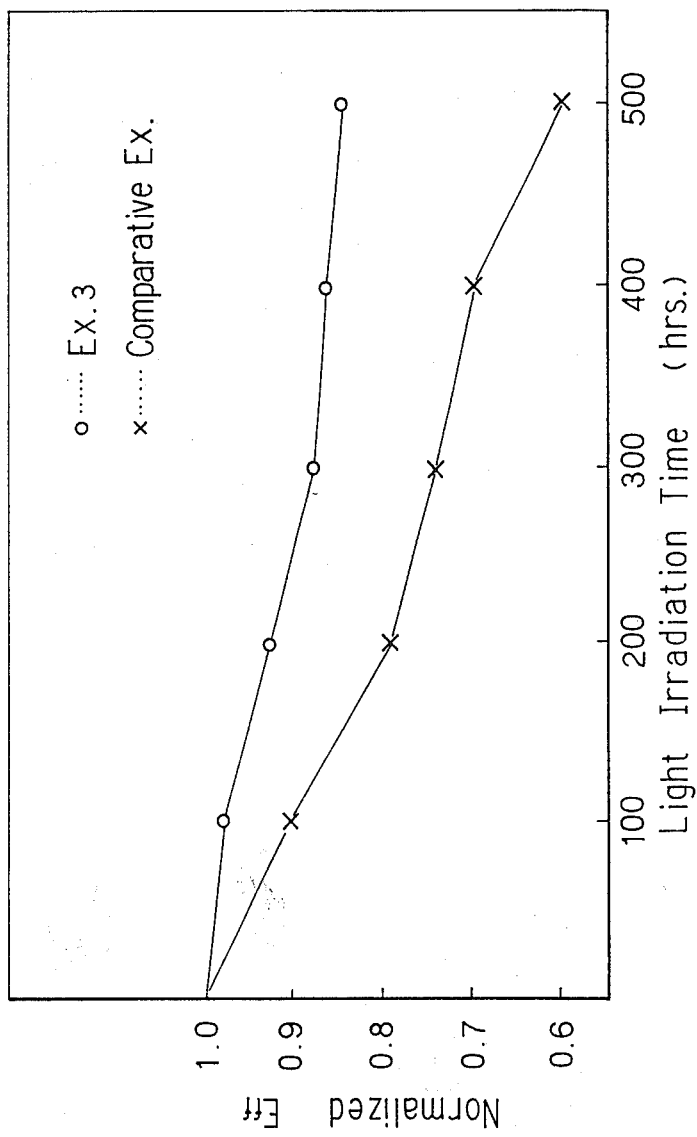
FIG. 3 is a graph on which the results of the continuous light irradiation test, effected on the solar batteries of the prior art and the present invention, are plotted.

In FIG. 3, the ordinate is the conversion efficiency ($E_{ff}$) observed at each time which is normalized by dividing it with the initial conversion efficiency ($E°_{ff}$).

From the results shown in FIG. 3, it is found that the reduction of the conversion efficiency is effectively restricted and the stability with respect to the light irradiation is maintained.

The amorphous photovoltaic elements according to the present invention has hereinbefore been explained in detail with reference to the non-limitative and preferred embodiments. However, it is not intended to restrict the scope of this invention to those specific embodiments as set forth above, on the contrary, it should be appreciated that the present invention includes various kinds of variations, alternatives, modifications and equivalents as may be included within the scope and spirit of this invention as defined by the appended claims. For instance, the present invention has been described with respect to the solar battery given as the specific example of photovoltaic elements; however, the present invention also includes other photovoltaic elements such as photodetectors for the optical communications and photosensors, for instance, photodiodes, avalanche photodiodes. In any case, the technical idea of the invention should be considered to be applicable to an devices comprising at least one pin or nip junction and including an i-type layer of a-SiGe:H film.

TABLE I

The Construction and the Output Properties of the Solar Batteries

| | Buffer Layer (Å) | | | | | | | |
|---|---|---|---|---|---|---|---|---|
| | p-Type Layer | Buffer Layer | i-Type Layer | n-Type Layer | Jsc (mA/cm²) | Voc (V) | FF (%) | Eff (%) |
| Comparative Example | 130 | 0 | 3,000 | 500 | 11.0 | 0.58 | 41 | 2.6 |
| Example | | | | | | | | |
| 1 | 130 | 150 | 3,000 | 500 | 13.1 | 0.60 | 50 | 3.9 |
| 2 | 130 | 300 | 3,000 | 500 | 13.4 | 0.62 | 52 | 4.3 |
| 3 | 130 | 450 | 3,000 | 500 | 14.0 | 0.63 | 51 | 4.5 |
| 4* | 130 | 400 | 3,000 | 500 | 14.4 | 0.63 | 52 | 4.7 |
| Reference Example | | | | | | | | |
| 1 | 130 | 50 | 3,000 | 500 | 11.9 | 0.58 | 43 | 3.0 |
| 2 | 130 | 800 | 3,000 | 500 | 12.4 | 0.63 | 44 | 3.4 |

*In the sample of Ex. 4, a graded layer 80Å thick was formed in the buffer layer in which the Ge concentration was gradually increased towards the i-type layer beneath the buffer layer.

As seen from the results listed in Table I, it is found that all of the output properties (Jsc, Voc, FF) are improved by disposing a buffer layer having a desired thickness and comprised of the a-Si:H film between the p-type layer and the i-type layer according to the present invention, and as a result the photoelectric conversion efficiency ($E_{ff}$) is also significantly increased. While the results of the reference examples 1 and 2 show that these samples provide values of Voc comparable to those of the samples according to the present invention, however, the values of Jsc and FF are greatly reduced compared with the samples of the present invention and accordingly $E_{ff}$ is also decreased with respect to the reference samples. This fact clearly shows

What is claimed is:

1. A photovoltaic element of pin type structure comprising a pair of electrodes and an amorphous silicon body sandwiched between the pair of electrodes, the amorphous silicon body including a p-type amorphous silicon layer, an i-type amorphous silicon germanium layer, and an n-type amorphous silicon layer laminated in the named order, characterized in that an i-type amorphous silicon buffer layer having a thickness of 100 to 500 angstroms is disposed between the p-type layer and the i-type layer, and in that germanium is added to the portion of the buffer layer at the side adjacent to the i-type over a thickness of from 50 to 150 angstroms, said portion having a germanium concentration gradient which gradually increases towards the i-type layer.

2. A photovoltaic element as set forth in claim 1 wherein the thickness of said portion of the buffer layer to which germanium is added is within the range of from 70 to 120 angstroms.

3. A photovoltaic element as set forth in claim 1 wherein the i-type layer contains a Group III element of the Periodic Table in an amount of from 0.2 to 3 ppm.

4. A photovoltaic element as set forth in claim 1 wherein an antireflection film is disposed on the top of the element to which the incident light is irradiated.

5. A photovoltaic element as set forth in claim 1 wherein each layer includes at least one of hydrogen and fluorine.

* * * * *